United States Patent
Fu et al.

(10) Patent No.: US 11,079,356 B2
(45) Date of Patent: Aug. 3, 2021

(54) ULTRASONIC SENSING APPARATUS

(71) Applicant: Qian Jun Technology Ltd., Zhubei (TW)

(72) Inventors: Yu-Yen Fu, Zhubei (TW); Po-Chun Yeh, Zhubei (TW); Dong-Fu Chen, Zhubei (TW)

(73) Assignee: Qian Jun Technology Ltd., Zhubei (TW)

( * ) Notice: Subject to any disclaimer, the term of this patent is extended or adjusted under 35 U.S.C. 154(b) by 4 days.

(21) Appl. No.: 16/847,684

(22) Filed: Apr. 14, 2020

(65) Prior Publication Data

US 2020/0393413 A1    Dec. 17, 2020

(30) Foreign Application Priority Data

Jun. 12, 2019 (TW) ................................ 108120242

(51) Int. Cl.
*G01N 29/02* (2006.01)
*G01F 23/296* (2006.01)
*G01N 29/22* (2006.01)

(52) U.S. Cl.
CPC .......... *G01N 29/02* (2013.01); *G01F 23/296* (2013.01); *G01N 29/22* (2013.01); *G01N 2291/022* (2013.01)

(58) Field of Classification Search
CPC ...... G01N 29/02; G01N 29/22; G01N 29/222; G01N 29/2437; G01F 23/296
USPC .......................................................... 73/649
See application file for complete search history.

(56) References Cited

U.S. PATENT DOCUMENTS

2013/0214642 A1*  8/2013  Lin ...................... G10K 11/004
                                                                  310/319

* cited by examiner

*Primary Examiner* — Tarun Sinha

(57) ABSTRACT

An ultrasonic sensing apparatus includes an accommodating shell and at least one detection device. The accommodating shell includes a base and a convex portion connected to the base. A side of the base has a first detection opening toward a first direction, and a side of the convex portion has a second detection opening toward a second direction. Each of the at least one detection device is disposed in the base or the convex portion of the accommodating shell and includes a board, a piezoelectric assembly, a housing and a plurality of fixing members. The plurality of fixing members are configured to fix the board on the top wall of the housing to press the board to the encapsulating body of the piezoelectric assembly, thereby pressing the piezoelectric sheet to the bottom wall.

18 Claims, 5 Drawing Sheets

ULTRASONIC SENSING APPARATUS

FIELD OF THE INVENTION

The present invention relates to a sensing apparatus, and more particularly to an ultrasonic sensing apparatus including multi-purpose.

BACKGROUND OF THE INVENTION

A diesel engine needs to be equipped with Selective catalytic reduction (SCR) to reduce toxic nitrogen oxide (NOx) emission. SCR can neutralize the toxic hydronitrogen by adding urea to the diesel fuel to convert the toxic hydronitrogen into water and nitrogen. When the concentration of urea in the diesel is insufficient, the diesel engine may have too much hydronitrogen emission.

The urea used in the diesel engine may be mixed with water and stored in a storage tank adjacent to the diesel engine. Usually, a plurality of ultrasonic detecting devices can be arranged beside the storage tank to detect the urea concentration or liquid level of the urea in the storage tank.

The conventional ultrasonic sensing apparatus primarily comprises a housing and a piezoelectric sheet placed in the housing. In order to attach the piezoelectric sheet to the sensing surface in the housing, it is necessary to inject an encapsulant into the housing after placing the piezoelectric sheet in the housing.

However, the encapsulant is adhered to a bottom of the housing, so that entire of an ultrasonic sensing apparatus may be retired when the piezoelectric sheet is damaged.

Specifically, when two piezoelectric sheets for different purposes are encapsulated in a housing of an ultrasonic sensing apparatus, it is necessary to inject the encapsulant on each of the two piezoelectric sheets, therefore resulting in a complicated process. Because the piezoelectric sheets cannot be replaced, entire of an ultrasonic sensing apparatus may scrap even simply only one of the piezoelectric sheets was damaged, therefore causing waste of materials.

SUMMARY OF THE INVENTION

The present invention provides an ultrasonic sensing apparatus, the detection device thereof is convenient to be detached and changed, and the material cost thereof can be saved.

The present invention provides an ultrasonic sensing apparatus including an accommodating shell and at least one detection device. The accommodating shell includes a base and a convex portion connected to the base, wherein a side of the base has a first detection opening toward a first direction, and a side of the convex portion has a second detection opening toward a second direction. Each of the at least one detection device is disposed in the base or the convex portion of the accommodating shell and includes a board, a piezoelectric assembly, a housing and a plurality of fixing members. The board is disposed in the accommodating shell and covering the first detection opening or the second detection opening. The piezoelectric assembly includes an encapsulating body and a piezoelectric sheet, wherein at least a portion of the piezoelectric sheet is enclosed by the encapsulating body, the encapsulating body is disposed on the board, and the piezoelectric sheet has a sensing surface exposed to the encapsulating body and away from the board. The housing includes a top wall, a bottom wall and a surrounding side wall connected between the top wall and the bottom wall and surrounding the encapsulating body, wherein the top wall has an opening formed at the position where the top wall is connected with the surrounding side wall and opposite to the bottom wall, and the top wall is disposed on the board, so that at least the bottom wall of the housing is exposed to the first detection opening or the second detection opening. The plurality of fixing members are configured to fix the board on the top wall of the housing to press the board to the encapsulating body of the piezoelectric assembly, thereby pressing the sensing surface of the piezoelectric sheet to the bottom wall.

In an embodiment of the present invention, a quantity of the at least one detection device is two, and the housings of the two detection devices are exposed to the first detection opening and the second detection opening respectively.

In an embodiment of the present invention, the first direction is perpendicular to the second direction.

In an embodiment of the present invention, the accommodating shell further includes a board part connected to the base, a reflective sheet is disposed on the board part and opposite to the second detection opening, wherein the reflective sheet is configured to reflect a vibration signal of the piezoelectric sheet of the at least one detection device when the at least one detection device is disposed in the convex portion.

In an embodiment of the present invention, the ultrasonic sensing apparatus further includes a waveguide connected to the first detection opening and extended away from the base along the first direction, wherein the waveguide is configured to concentrate a vibration signal of the piezoelectric sheet of the at least one detection device when the at least one detection device is disposed in the base.

In an embodiment of the present invention, the ultrasonic sensing apparatus further includes a cable conduit communicating with the convex portion, wherein each of the at least one detection device comprises at least one cable, and the cable conduit is configured to guide the at least one cable to an outside of the accommodating shell.

In an embodiment of the present invention, the board is bent or flat.

In an embodiment of the present invention, the board is a circuit board.

In an embodiment of the present invention, the piezoelectric assembly further includes a positive guide pin having an end connected to the piezoelectric sheet and a negative guide pin having an end connected to the piezoelectric sheet, the positive guide pin and the negative guide pin pass through the encapsulating body, and the board has two openings allowing the positive guide pin and the negative guide pin to pass therethrough.

In an embodiment of the present invention, the encapsulating body is adhered to the surrounding side wall.

In an embodiment of the present invention, the encapsulating body has a surrounding shape conformed to the surrounding side wall.

In an embodiment of the present invention, the piezoelectric assembly further comprises a matching layer or a conducting layer disposed on the sensing layer of the piezoelectric sheet and corresponding to vibration energy of the piezoelectric sheet.

In an embodiment of the present invention, each of the plurality of fixing members is a screw, the board has a plurality of through holes, and the top wall has a plurality of screw holes.

In an embodiment of the present invention, the encapsulating body comprises a matching layer and/or an absorbing layer corresponding to vibration energy of the piezoelectric sheet.

In the ultrasonic sensing apparatus of the embodiments of the present invention, the same detection devices can be arranged on different positions of the accommodating shell for proceeding different sensing tasks. The detection devices can be detached and replaced respectively when any one of them fails, therefore preventing the whole ultrasonic sensing apparatus from scrapping, resulting in waste of materials. In addition, since the piezoelectric assembly of each of the detection devices has been integrated with the elements including the housing and the board in advance to form a module, the detection devices can be connected to the accommodating shell by the same method even they are arranged on different positions of the accommodating shell with different arranging directions.

Other objectives, features and advantages of the invention will be further understood from the further technological features disclosed by the embodiments of the invention.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
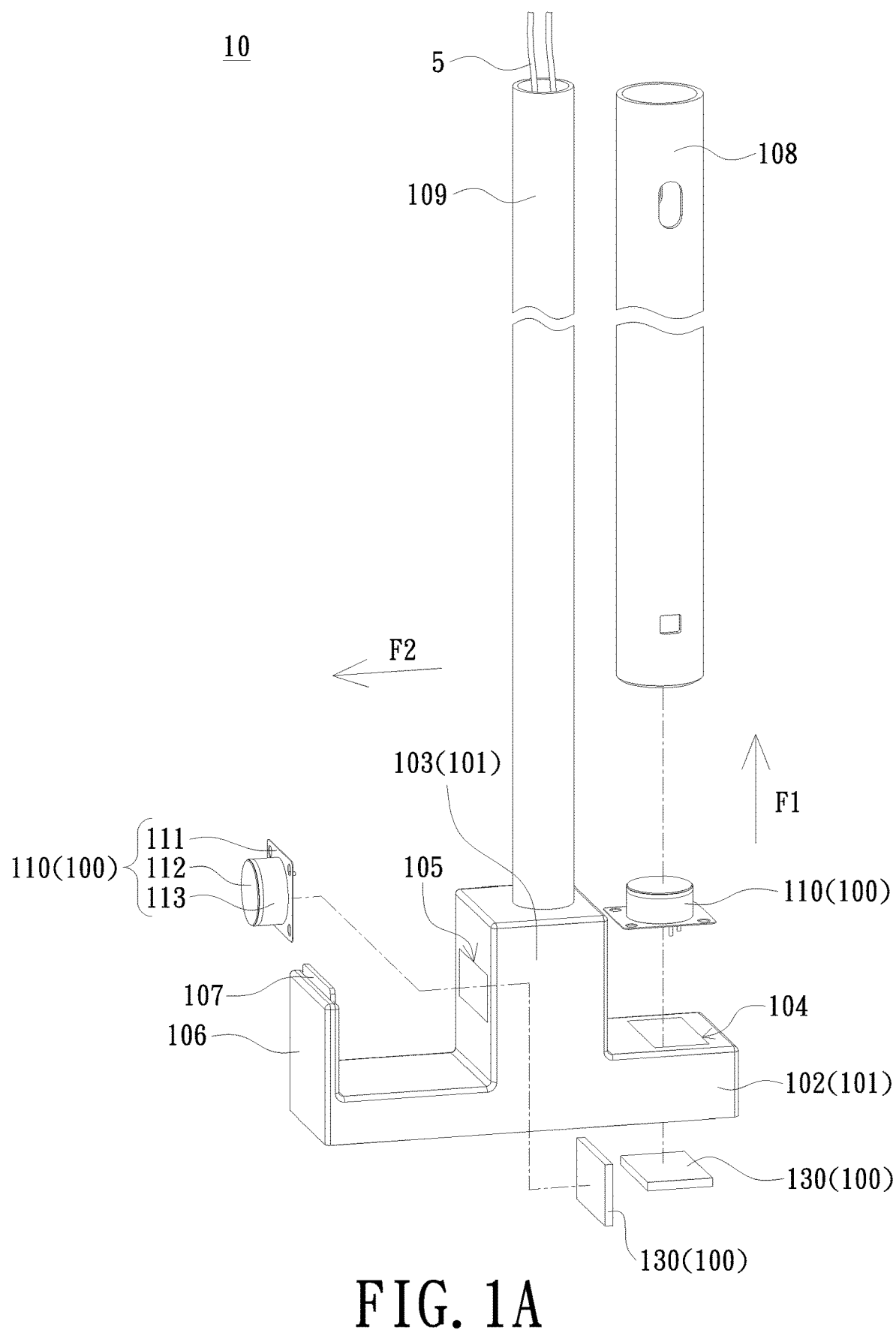
FIG. 1A is a schematic exploded view of an ultrasonic sensing apparatus of an embodiment of the present invention.
Figure 1B:
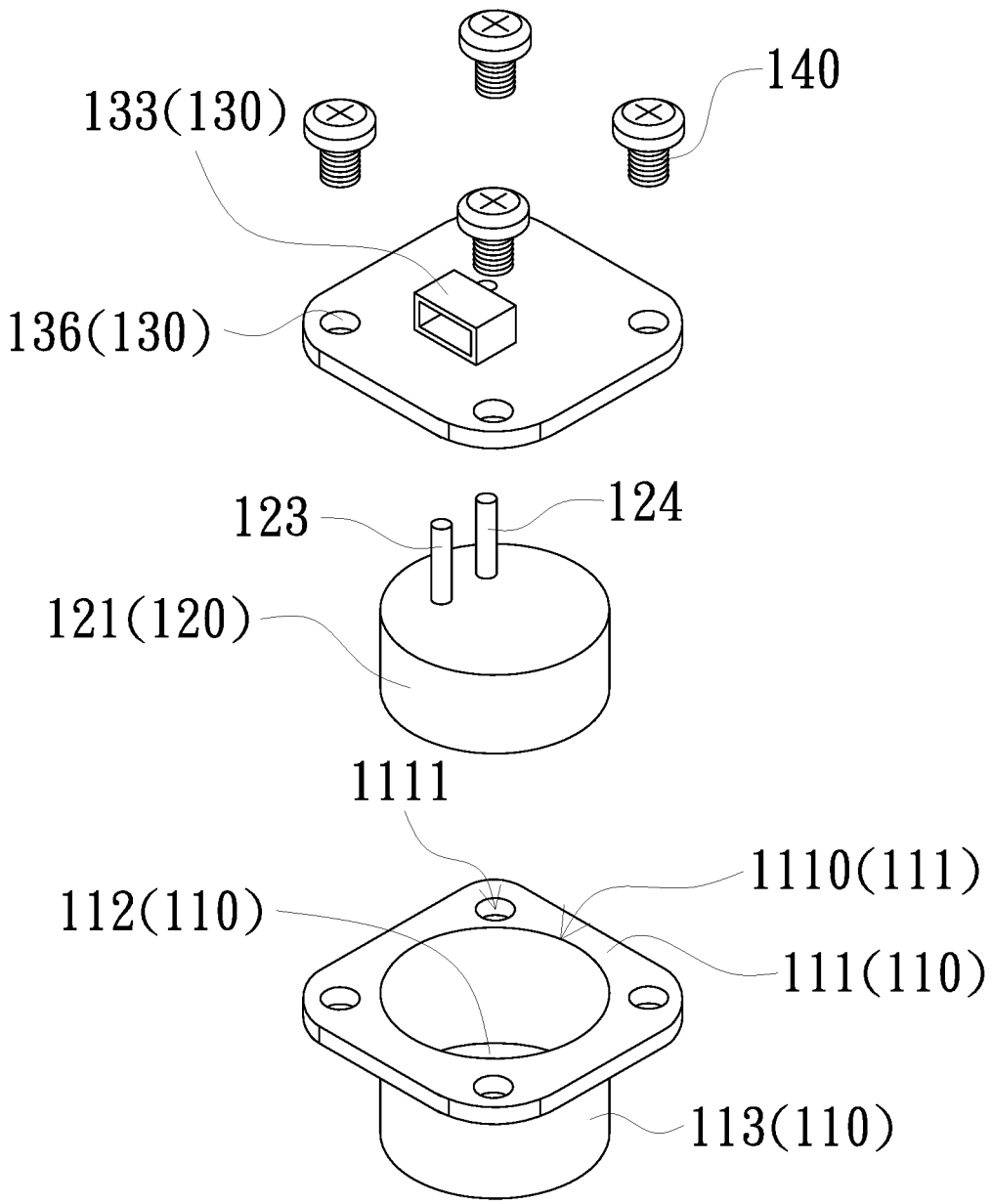
FIG. 1B is a schematic exploded view of the detection device of FIG. 1A.
Figure 1C:
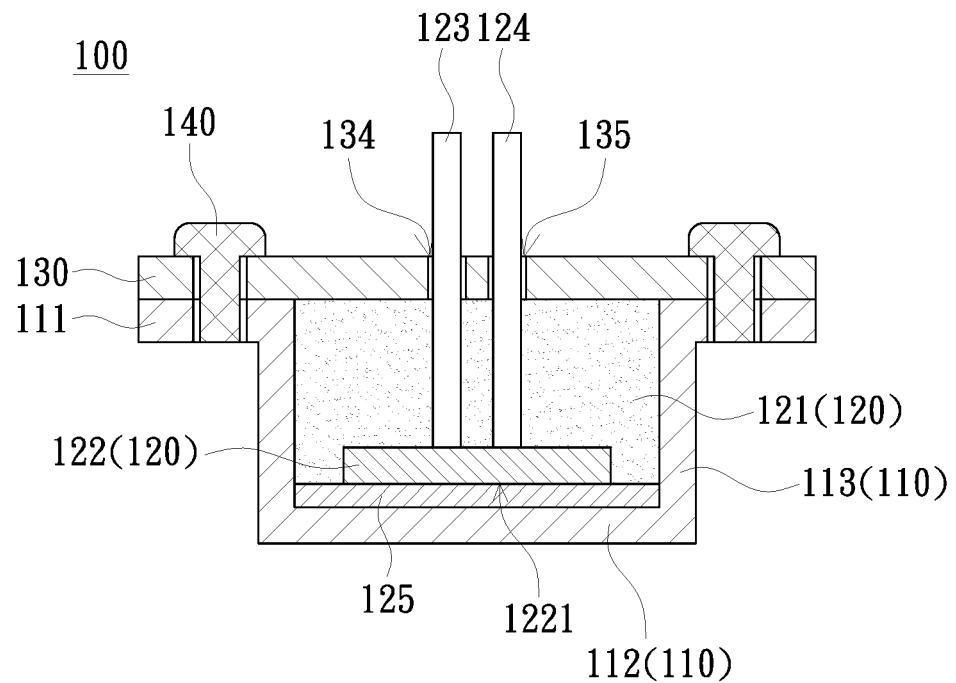
FIG. 1C is a schematic cross-sectional view of the detection device of FIG. 1A.

FIG. 1A is a schematic exploded view of an ultrasonic sensing apparatus of an embodiment of the present invention. FIG. 1B is a schematic exploded view of the detection device 100 in FIG. 1A. FIG. 1C is a schematic cross-sectional view of the detection device 100 in FIG. 1A. Please refer to FIGS. 1A to 1C, an ultrasonic sensing apparatus 10 of the present embodiment includes an accommodating shell 101 and at least one detection device 100.

The accommodating shell 101 includes a base 102 and a convex portion 103 connected to the base 102. A side of the base 102 has a first detection opening 104 toward a first direction F1, and a side of the convex portion 103 has a second detection opening 105 toward a second direction F2. Each detection device 100 is disposed in the base 102 or the convex portion 103 of the accommodating shell 101 and includes a board 130, a piezoelectric assembly 120, a housing 110 and a plurality of fixing members 140. The board 130 is disposed in the accommodating shell 101 and covers the first detection opening 104 or the second detection opening 105. The piezoelectric assembly 120 includes an encapsulating body 121 and a piezoelectric sheet 122, wherein at least a portion of the piezoelectric sheet 122 is enclosed by the encapsulating body 121. The encapsulating body 121 is disposed on the board 130, and the piezoelectric sheet 122 has a sensing surface 1221 exposed to the encapsulating body 121 and away from the board 130.

The housing 110 includes a top wall 111, a bottom wall 112 and a surrounding side wall 113 connected between the top wall 111 and the bottom wall 112 and surrounding the encapsulating body 121. The top wall 111 is disposed on the board 130, and at least the bottom wall 112 of the housing 110 is exposed to the first detection opening 104 or the second detection opening 105 for detecting a liquid when the accommodating shell 101 is disposed in the liquid. In the present embodiment, the bottom wall 112 and the surrounding side wall 113 of the housing 110 of the detection device 100 are convexly protruded from the first detection opening 104 or the second detection opening 105. The plurality of fixing members 140 are configured to fix the board 130 on the top wall 111 of the housing 110 to press the board 130 to the encapsulating body 121 of the piezoelectric assembly 120, thereby pressing the sensing surface 1221 of the piezoelectric sheet 122 to the bottom wall 112.

In the present embodiment, a quantity of the detection device 100 is two, and the housings 110 of the two detection devices 100 are exposed to the first detection opening 104 and the second detection opening 105 respectively, but are not limited thereto. In another embodiment, the detection device 100 may be disposed only in the base 102 or the convex portion 103.

In the present embodiment, the first direction F1 is perpendicular to the second direction F2, that is, the convex portion 103 is perpendicularly connected to the base 102, but is not limited thereto. In another embodiment, the convex portion 103 can be connected to the base 102 by another angle.

In the present embodiment, the accommodating shell 101 further includes a board part 106 connected to the base 102. A reflective sheet 107 can be disposed on the board part 106 and opposite to the second detection opening 105. The reflective sheet 107 is configured to reflect a vibration signal of the piezoelectric sheet 122 of the detection device 100 to detect a concentration of a liquid when the detection device 100 is disposed in the convex portion 103.

In the present embodiment, a waveguide 108 connected to the first detection opening 104 and extended away from the base 102 along the first direction F1 is further provided. The waveguide 108 is configured to concentrate a vibration signal of the piezoelectric sheet 122 of the detection device 100 to detect a level of a liquid when the detection device 100 is disposed in the base 102.

In the present embodiment, a cable conduit 109 communicating with the convex portion 103 is further provided. The cable conduit 109 is configured to accommodate at least one cable 5 connected to the detection device 100.

In the present embodiment, the board 130 may have a single material or a composite material. In the present embodiment, the board 130 may be a circuit board. For example, a connector 133 may be disposed on the board 130 to electrically connect to the piezoelectric sheet 122 or an external device (not shown). Each of the boards 130 of the two detection devices 100 can be a circuit board, or one of them is a circuit board. A wire (not shown) can be connected to the two detection devices 100, and signal can be transmitted to an external analysis device (not shown) by the cable 5.

Figure 1D:
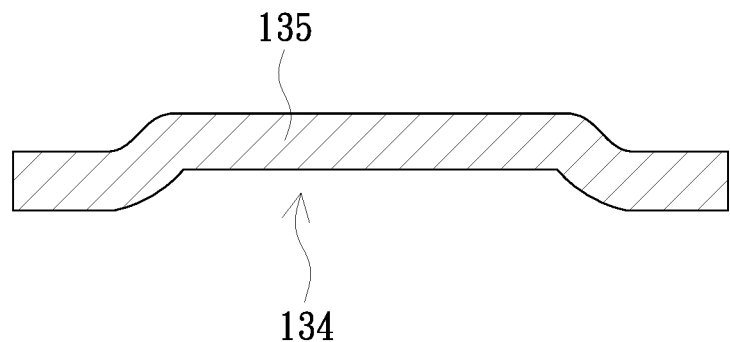
FIG. 1D is a schematic diagram of a board of another embodiment of the present invention.

In the present embodiment, the board 130 is flat, but is not limited thereto. For example, FIG. 1D illustrates a board 130a in a bent shape. The board 130a has a concave portion 134 on a side and a corresponding convex portion 135 on the other side. The encapsulating body 121 may abut against the concave portion 134 when the encapsulating body 121 protrudes from the opening 1110 of the top wall 111. Alternatively, the encapsulating body 121 may abut against the convex portion 135 when the encapsulating body 121 is recessed in the opening 1110 of the top wall 111.

In the present embodiment, the encapsulating body 121 and the piezoelectric sheet 122 of the piezoelectric assembly 120 may be combined in a mold in advance, and therefore a manufacturing method of the detection device 100 of the present embodiment may include steps of: a) providing the housing 110; b) providing the piezoelectric assembly 120; c) disposing the piezoelectric assembly 120 on the bottom wall 112 of the housing 110; d) covering the board 130 on the top wall 111; and e) fixing the board 130 to the top wall 111 by the plurality of fixing members 140.

In the present embodiment, the encapsulating body 121 of the piezoelectric assembly 120 has a surrounding shape conformed to the surrounding side wall 113, such as the round shape as shown in FIG. 1B, but is not limited thereto. The encapsulating body 121 may be conformed to the surrounding side wall 113 with other shapes such as polygon. The encapsulating body 121 may include a matching layer and/or an absorbing layer corresponding to vibration energy of the piezoelectric sheet 122. The material of the matching layer and/or the absorbing layer may include epoxy, SiOx or other colloid.

In the present embodiment, the piezoelectric assembly 120 further includes a colloid layer 125 disposed on the sensing layer 1221 of the piezoelectric sheet 122. The colloid layer 125 may be a matching layer or a conducting layer corresponding to vibration energy of the piezoelectric sheet 122.

In the present embodiment, the piezoelectric assembly 120 may further include a positive guide pin 123 having an end connected to the piezoelectric sheet 122 and a negative guide pin 124 having an end connected to the piezoelectric sheet 122. The positive guide pin 123 and the negative guide pin 124 pass through the encapsulating body 121. The board 130 has an opening 137 and an opening 138 allowing the positive guide pin 123 and the negative guide pin 124 to pass therethrough respectively. The positive guide pin 123 and the negative guide pin 124 may connect to an external power supply (not shown).

In the present embodiment, each of the plurality of fixing members 140 is a screw, the board 130 has a plurality of through holes 136, and the top wall 111 of the housing 110 has a plurality of screw holes 1111. The board 130 can be fixed to the top wall 111 and pressed to the encapsulating body 121 by locking the fixing members 140 to the screw holes 1111. The quantity of the fixing members 140 is at least three for balancing the downward pressure on the board 130, but is not limited thereto. In another embodiment, the fixing members 140 can be such as clamping members or fastening members.

In the present embodiment, the material of the housing 110 may be metal such as stainless steel, aluminum alloy or other alloy, but is not limited thereto. The material of the housing 110 may be also an insulating plastic material such as Polyamide (PA), Polyethylene (PE) or Polypropylene (PP).

In the ultrasonic sensing apparatus of the present embodiment, the same detection devices 100 can be arranged on different positions of the accommodating shell 101 for proceeding different sensing tasks. The detection devices 100 can be detached and replaced respectively when any one of them fails, therefore preventing the whole ultrasonic sensing apparatus 10 from scrapping, resulting in waste of materials. In addition, since the piezoelectric assembly 120 of each of the detection devices 100 has been integrated with the elements including the housing 110 and the board 130 in advance to form a module, the detection devices 100 can be connected to the accommodating shell 101 by the same method even they are arranged on different positions of the accommodating shell 101 with different arranging directions.

FIGS. 2A to 2D are schematic diagrams of a manufacturing method of a detection device of another embodiment of the present invention. The manufacturing method of a detection device 100a includes following steps.

Figure 2A:
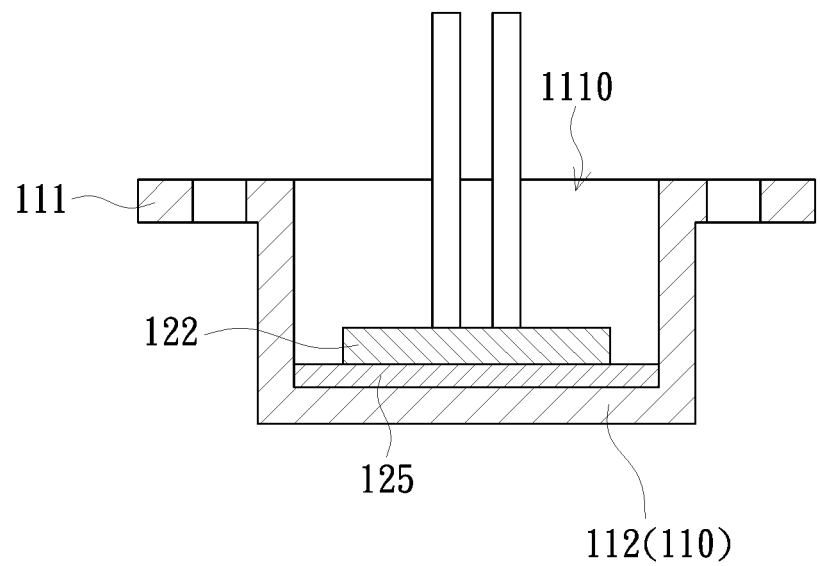
FIGS. 2A to 2D are schematic diagrams of a manufacturing method of a detection device of another embodiment of the present invention.

Please refer to FIG. 2A first. The housing 110 in FIG. 1B is provided. Then, the colloid layer 125 is disposed to cover the bottom wall 112 of the housing 110. Then, the piezoelectric sheet 122 is disposed in the housing 110 and placed on the bottom wall 112 via the opening 1110 of the top wall 111. The colloid layer 125 can provide a preliminary positioning to the piezoelectric sheet 122.

Figure 2B:
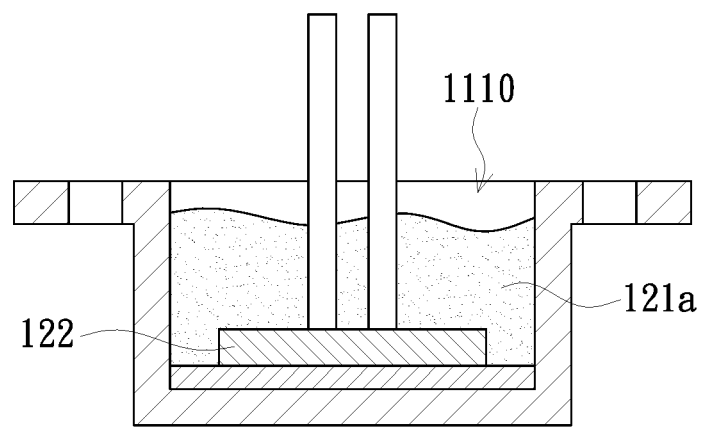

Please refer next to FIG. 2B. A liquid colloid 121a is injected into the opening 1110 to cover the piezoelectric sheet 122. The colloid 121a can be a state before the encapsulating body 121 of FIG. 1B is cured.

Figure 2C:
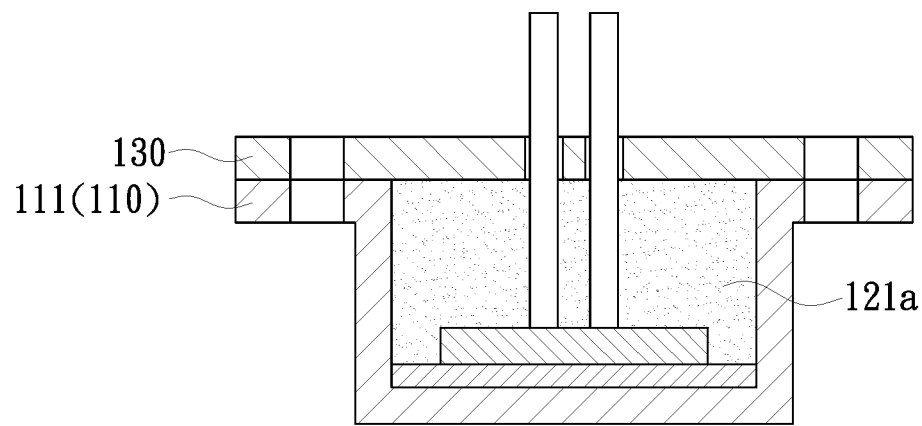

Please refer next to FIG. 2C. The board 130 in FIG. 1B is provided to cover the top wall 111 of the housing 110. The board 130 can be disposed before or after the colloid 121a is cured as needed.

Figure 2D:
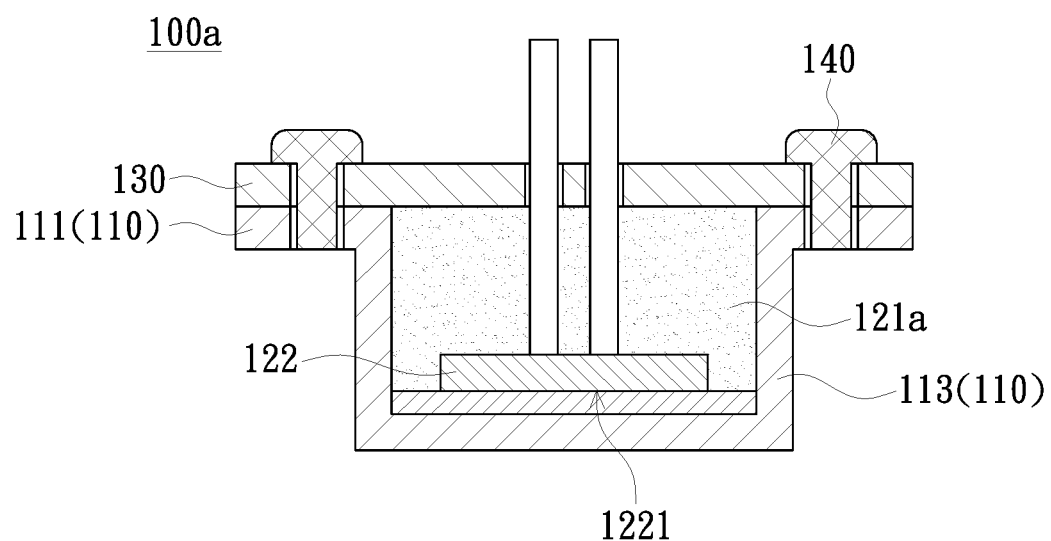

Please refer next to FIG. 2D. The fixing members 140 are used to fix the board 130 to the top wall 111 to press the board 130 to the colloid 121a, thereby pressing the sensing surface 1221 of the piezoelectric sheet 122 to the bottom wall 112. The detection device 100a of the present embodiment is manufactured after the colloid 121a is cured as the encapsulating body in FIG. 1B.

The detection device 100a of the present embodiment is similar to the detection device 100 of FIG. 1B. The difference is that the encapsulating body 121 of the present embodiment is cured in the housing 110, and therefore the encapsulating body 121 may be adhered to the surrounding side wall 113 of the housing 110.

In the ultrasonic sensing apparatus of the embodiments of the present invention, the same detection devices can be arranged on different positions of the accommodating shell for proceeding different sensing tasks. The detection devices can be detached and replaced respectively when any one of them fails, therefore preventing the whole ultrasonic sensing apparatus from scrapping, resulting in waste of materials. In addition, since the piezoelectric assembly of each of the detection devices has been integrated with the elements including the housing and the board in advance to form a module, the detection devices can be connected to the accommodating shell by the same method even they are arranged on different positions of the accommodating shell with different arranging directions.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An ultrasonic sensing apparatus, comprising:
    an accommodating shell, comprising a base and a convex portion connected to the base, wherein a side of the base has a first detection opening toward a first direction, and a side of the convex portion has a second detection opening toward a second direction; and
    at least one detection device, wherein each of the at least one detection device is disposed in the base or the convex portion of the accommodating shell and comprises:
        a board, disposed in the accommodating shell and covering the first detection opening or the second detection opening;
        a piezoelectric assembly, comprising an encapsulating body and a piezoelectric sheet, wherein at least a portion of the piezoelectric sheet is enclosed by the encapsulating body, the encapsulating body is disposed on the board, and the piezoelectric sheet has a sensing surface exposed to the encapsulating body and away from the board;
        a housing, comprising a top wall, a bottom wall and a surrounding side wall connected between the top wall and the bottom wall and surrounding the encapsulating body, wherein the top wall has an opening formed at the position where the top wall is connected with the surrounding side wall and opposite to the bottom wall, and the top wall is disposed on the board, so that at least the bottom wall of the housing is exposed to the first detection opening or the second detection opening; and
        a plurality of fixing members, configured to fix the board on the top wall of the housing to press the board to the encapsulating body of the piezoelectric assembly, thereby pressing the sensing surface of the piezoelectric sheet to the bottom wall.

2. The ultrasonic sensing apparatus according to claim 1, further comprising a cable conduit communicating with the convex portion, wherein each of the at least one detection device comprises at least one cable, and the cable conduit is configured to guide the at least one cable to an outside of the accommodating shell.

3. The ultrasonic sensing apparatus according to claim 1, wherein a quantity of the at least one detection device is two, and the housings of the two detection devices are exposed to the first detection opening and the second detection opening respectively.

4. The ultrasonic sensing apparatus according to claim 3, further comprising a cable conduit communicating with the convex portion, wherein each of the at least one detection device comprises at least one cable, and the cable conduit is configured to guide the at least one cable to an outside of the accommodating shell.

5. The ultrasonic sensing apparatus according to claim 1, wherein the first direction is perpendicular to the second direction.

6. The ultrasonic sensing apparatus according to claim 5, further comprising a cable conduit communicating with the convex portion, wherein each of the at least one detection device comprises at least one cable, and the cable conduit is configured to guide the at least one cable to an outside of the accommodating shell.

7. The ultrasonic sensing apparatus according to claim 1, wherein the accommodating shell further comprises a board part connected to the base, a reflective sheet is disposed on the board part and opposite to the second detection opening, wherein the reflective sheet is configured to reflect a vibration signal of the piezoelectric sheet of the at least one detection device when the at least one detection device is disposed in the convex portion.

8. The ultrasonic sensing apparatus according to claim 7, further comprising a cable conduit communicating with the convex portion, wherein each of the at least one detection device comprises at least one cable, and the cable conduit is configured to guide the at least one cable to an outside of the accommodating shell.

9. The ultrasonic sensing apparatus according to claim 1, further comprising a waveguide connected to the first detection opening and extended away from the base along the first direction, wherein the waveguide is configured to concentrate a vibration signal of the piezoelectric sheet of the at least one detection device when the at least one detection device is disposed in the base.

10. The ultrasonic sensing apparatus according to claim 9, further comprising a cable conduit communicating with the convex portion, wherein each of the at least one detection device comprises at least one cable, and the cable conduit is configured to guide the at least one cable to an outside of the accommodating shell.

11. The ultrasonic sensing apparatus according to claim 1, wherein the board is bent or flat.

12. The ultrasonic sensing apparatus according to claim 1, wherein the board is a circuit board.

13. The ultrasonic sensing apparatus according to claim 1, wherein the piezoelectric assembly further comprises a positive guide pin having an end connected to the piezoelectric sheet and a negative guide pin having an end connected to the piezoelectric sheet, the positive guide pin and the negative guide pin pass through the encapsulating body, and the board has two openings allowing the positive guide pin and the negative guide pin to pass therethrough.

14. The ultrasonic sensing apparatus according to claim 1, wherein the encapsulating body is adhered to the surrounding side wall.

15. The ultrasonic sensing apparatus according to claim 1, wherein the encapsulating body has a surrounding shape conformed to the surrounding side wall.

16. The ultrasonic sensing apparatus according to claim 1, wherein the piezoelectric assembly further comprises a matching layer or a conducting layer disposed on the sensing layer of the piezoelectric sheet and corresponding to vibration energy of the piezoelectric sheet.

17. The ultrasonic sensing apparatus according to claim 1, wherein each of the plurality of fixing members is a screw, the board has a plurality of through holes, and the top wall has a plurality of screw holes.

18. The ultrasonic sensing apparatus according to claim 1, wherein the encapsulating body comprises a matching layer and/or an absorbing layer corresponding to vibration energy of the piezoelectric sheet.

* * * * *